US005132552A

United States Patent [19]

Ito et al.

[11] Patent Number: 5,132,552

[45] Date of Patent: Jul. 21, 1992

[54] LINEAR INTERPOLATOR

[75] Inventors: Takeshi Ito; Yuji Fujita, both of Kawasaki, Japan

[73] Assignee: Kikusui Electronics Corporation, Kanagawa, Japan

[21] Appl. No.: 743,789

[22] Filed: Aug. 12, 1991

[30] Foreign Application Priority Data

Aug. 14, 1990 [JP] Japan .................................. 2-213692

[51] Int. Cl.[5] ...................... H03K 5/00; H03K 17/687; G06G 7/12; G06G 7/18

[52] U.S. Cl. .................................... 307/261; 328/127; 328/176; 307/490; 307/578; 307/482

[58] Field of Search ................. 328/127, 128, 176, 13, 328/14; 307/264, 352, 359, 578, 482, 490, 261; 330/293; 307/261

[56] References Cited

U.S. PATENT DOCUMENTS

| | | | |
|---|---|---|---|
| 4,223,271 | 9/1980 | Furukawa | 328/128 |
| 4,365,204 | 12/1982 | Hague | 328/127 |
| 4,524,326 | 6/1985 | Larson | 328/14 |
| 4,584,559 | 4/1986 | Penney | 340/340 |
| 4,894,620 | 1/1990 | Nagaraj | 328/127 |

*Primary Examiner*—Stanley D. Miller
*Assistant Examiner*—Sinh N. Tran
*Attorney, Agent, or Firm*—Finnegan, Henderson, Farabow, Garrett & Dunner

[57] ABSTRACT

A linear interpolator comprising an amplifier, an integrator for integrating an output of the amplifier, a feedback circuit connected between the amplifier and the integrator for bootstrapping an input voltage of the amplifier by an output voltage from the integrator, and a switch for periodically supplying a staircase input signal to the amplifier. A linearly interpolated output is derived from the integrator. The discrete input signal changing stepwise can be linearly interpolated with high accuracy.

6 Claims, 8 Drawing Sheets

FIG.2A Ei
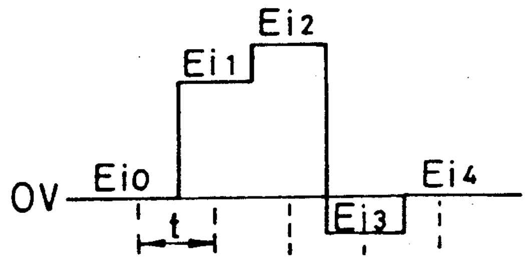
FIG.2B SP2
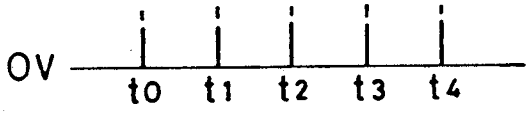
FIG.2C EBi
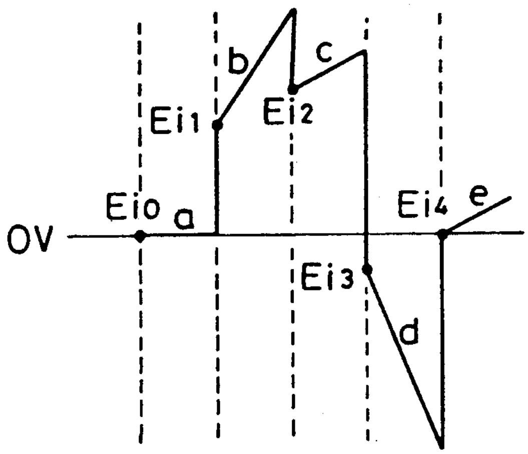
FIG.2D Ec
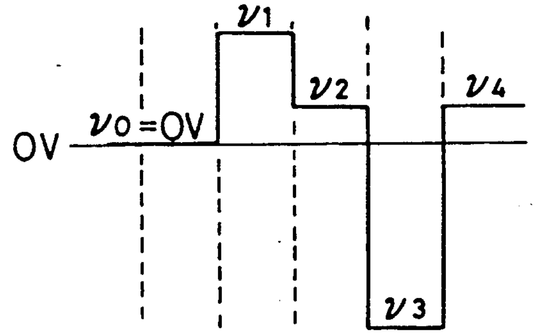
FIG.2E Eo
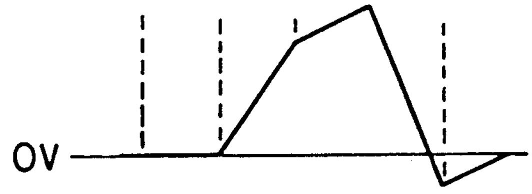
FIG.2F Ei/Eo
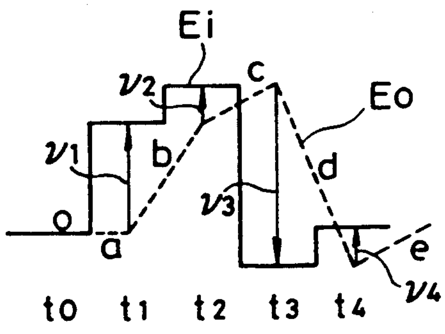

LINEAR INTERPOLATOR

BACKGROUND OF THE INVENTION

I. Field of the Invention

The present invention relates to a linear interpolator for linearly interpolating a staircase waveform signal varying stepwise at a fixed time interval to generate a smooth waveform.

II. Description of the Related Art

It is necessary to convert digital data into analog signals at the final output stage of a measuring instrument such as a digital oscilloscope or a digital function generator, a digital musical instrument, or an audio apparatus such as a compact disk or a digital audio tape recorder. A D/A converter is used to perform such conversion. A signal derived from a D/A converter or the like includes discretely defined staircase waveforms.

It is of critical importance for these apparatuses to transform such discretely defined staircase waveforms into continuous analog waveforms in order to achieve high performance.

FIG. 7 shows an example of a conventional linear interpolating circuit, and FIG. 8 illustrates input and output signal waveforms of various parts of the linear interpolating circuit shown in FIG. 7.

As shown in FIG. 7, the interpolator has a differential amplifier 1, a Miller integrator 2, and a sample-and-hold circuit 3. The differential amplifier 1 receives an input signal from an input terminal 4 at its non-inverting input terminal, and a signal from the sample-and-hold circuit 3 at its inverting input terminal. An output signal from the differential amplifier 1 is applied to the Miller integrator 2, and an output signal from the Miller integrator 2 is fed to an output terminal 5 as an output signal and to the sample-and-hold circuit 3. The sample-and-hold circuit 3 has a capacitor C1, and a switch SW1 which closes only when a sampling pulse SP is applied.

In the linear interpolator thus arranged, the differential amplifier 1 produces a voltage $E_R$ which is the difference between an input signal voltage $E_i+$ applied to input terminal 4 and an input voltage $E_i-$ obtained by sampling-and-holding the output signal at the output terminal 5. Then, the Miller integrator 2 produces an inclined voltage in accordance with the differential voltage $E_R$, i.e., in accordance with the input signal voltage $E_i+$, and outputs the inclined voltage as the output voltage $E_0$ from the output terminal 5.

This linear interpolator, however, has the following problems:

1) As shown in FIGS. 8A–8B, the input signal voltage $E_i+$ comprises a waveform including discrete step-like transitions, and the sampling pulses SP must be well adjusted to be positioned just before the transition (rising and falling edges) of the input signal voltage $E_i+$, which complicates the circuit design.

2) As shown in FIGS. 8A–8D, a difference 80 between the rising edge of the input signal voltage $E_i+$ and that of the sampling pulse SP distorts the pulse width PW of the differential voltage $E_R$ inputted to the Miller integrator 2.

3) When an input signal comprising a discrete waveform including discrete step-like transitions is supplied from a D/A converter, the input signal may sometimes include distortions 81 such as glitches or overshoots as shown in FIG. 8B. The distortions 81 appear in the output of the differential amplifier 1, which adversely affects the integration carried out by the Miller integrator 2.

4) As a result of 2) and 3) above, it is likely that an error is caused in the slope of the output voltage of the Miller integrator 2 as shown in FIG. 8E. This deteriorates the accuracy of the linear interpolation of the input signal.

5) Complicated circuits such as a differential amplifier and a Miller integrator are required.

6) It is difficult to change the time constant of the Miller integrator 2 because both ends of the resistor R1 and both ends of the capacitor C2 that specify the time constant are not grounded.

SUMMARY OF THE INVENTION

It is, therefore, an object of the present invention to provide a linear interpolator having a simple circuit arrangement that can overcome the above-mentioned problems, and can linearly interpolate an input signal with high percision to produce a linearly interpolated output signal.

In order to accomplish the object, the present invention provides a linear interpolator for linearly interpolating an input signal, comprising:

a first amplifier having an input terminal and an output terminal for producing a first signal;

switching means for periodically supplying the input signal to the input terminal of the first amplifier;

an integrator circuit, having an input terminal and an output terminal, the terminal of the integrator circuit being connected to the output terminal of the first amplifier, for integrating the first signal;

a feedback circuit connected between the input terminal of the first amplifier and the output terminal of the integrator circuit, for bootstrapping the voltage at the input terminal of the first amplifier by the voltage at the output terminal of the integrator circuit.

Here, the feedback circuit may comprise a capacitor.

The feedback circuit may also comprise a capacitor connected in series with a second amplifier.

Further, at least one of the first amplifier and the second amplifier may have a gain equal to or greater than one.

The feedback circuit may also comprise a first and a second capacitors wherein the switching circuit alternately and periodically controls the first and second capacitors such that one of the first and second capacitors tracks the input signal and the other of the first and second capacitors is connected to the input terminal of the first amplifier.

Still further, the integrator may include a resistor, a plurality of capacitors connected in common to the resistor, and a circuit for selecting one of the plurality of capacitors to form a time constant circuit including the resistor and the selected capacitor.

According to the present invention, the output terminal of the integrator which integrates the signal from the first amplifier bootstraps the input of the first amplifier through the feedback circuit, and a staircase input signal having transitions occurring at a fixed interval is periodically applied to the input of the first amplifier through the switching circuit. Thus, the input signal is linearly interpolated with high accuracy.

In accordance with the teachings of the present invention:

1) An input signal changing stepwise can be linearly interpolated with high precision;

2) Linear interpolation of the input signal is achieved without being adversely affected by waveform distortions such as glitches or overshoots because the sampling switch provided on the input side of the first amplifier can eliminate distortion which would otherwise occur in the D/A converter or the like;

3) The construction of the circuit including the peripheral circuits is simplified because precise adjustment of the sampling timing and the transitions of the input signal is not required;

4) Complicated circuits such as a differential amplifier and a Miller integrator are not required; and 5) Sampling periods can be easily altered because one end of the capacitor of the integrator is grounded.

The above and other objects, effects, features and advantages of the present invention will become more apparent from the following description of the embodiments thereof taken in conjunction with the accompanying drawings.

BRIEF DESCRIPTION OF THE DRAWINGS

FIGS. 2A-2F are timing charts illustrating input and output signal waveforms and timings in various parts of the embodiment shown in FIG. 1;

DETAILED DESCRIPTION OF PREFERRED EMBODIMENTS

The invention will now be described with reference to the accompanying drawings.

FIRST EMBODIMENT

Figure 1:
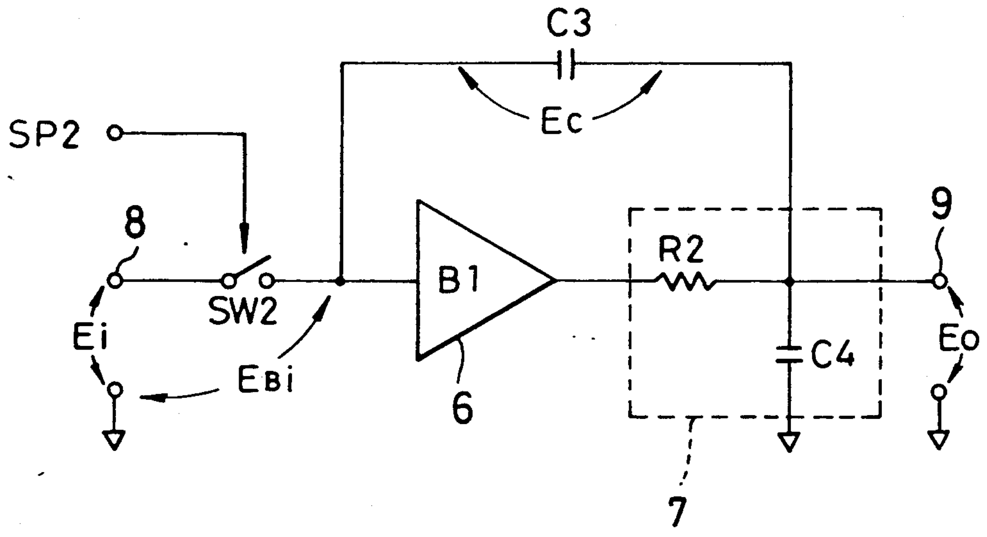
FIG. 1 is a circuit diagram showing an arrangement of a first embodiment of a linear interpolator according to the present invention.

FIG. 1 shows a first embodiment of a linear interpolator according to the present invention, and FIGS. 2A-2F illustrate timing charts of the input and output signals in various parts of the linear interpolator.

As shown in FIG. 1, the linear interpolator comprises a differential amplifier 6 with a low output impedance, an integrator 7 which receives a signal from the amplifier 6, a capacitor C3 which connects the output terminal of the integrator 7 to the input terminal of the amplifier 6, and a switch SW2 which connects an input terminal 8 to the input terminal of the amplifier 6. The integrator 7 includes a resistor R2 and a capacitor C4, and its output terminal is connected to an output terminal 9. The switch SW2 is controlled by a sampling pulse SP2. The switch SW2 is closed only when the sampling pulse SP2 is applied to the switch, thereby applying an input signal voltage $E_i$ from the input terminal 8 to the input terminal of the amplifier 6 and to the capacitor C3. The capacitances C3 and C4 of the capacitors C3 and C4 are such that $C3 << C4$.

FIG. 2A illustrates the input signal voltage $E_i$ having a staircase waveform;

FIG. 2B illustrates the sampling pulses SP2 that occur at a fixed interval t equal to the transition interval of the input signal;

FIG. 2C illustrates an input volatge $E_{Bi}$ applied to the amplifier 6;

FIG. 2D illustrates a voltage $E_c$ across the capacitor C3, that is, a voltage across the resistor R2;

FIG. 2E illustrates an output signal voltage $E_o$ at the output terminal 9; and FIG. 2F illustrates the input signal voltage $E_i$ and the output signal voltage $E_o$ in an overlapped manner.

Next, the operation of the linear interpolator shown in FIG. 1 will be explained with reference to FIGS. 2A-2F.

At a sampling instant t0, the input signal voltage $E_i$ ($E_i = E_{i0}$) is zero, so that the input voltage $E_{Bi}$ and the output signal voltage $E_o$ of the amplifier 6 are also zero. Thus, the voltage $E_c$ across the capacitor C3 is also zero ($E_c$ at this point is represented by v0 (=0) as shown in FIG. 2D).

At a sampling instant t1, the input signal voltage $E_i$ is $E_{i1}$, and at the same time, the input voltage $E_{Bi}$ to the amplifier 6 is also $E_{i1}$. Thus, the voltage $E_c$ across the capacitor C3 is also $E_{i1}$. At this instant t1, the output signal voltage $E_o$ at the output terminal 9 is still zero. Accordingly, at sampling instant t1, the voltage $E_c$ across the capacitor C3 is equal to the difference between the input signal voltage $E_i$ and the output signal voltage E0. The voltage across the capacitor C3 is also applied to both ends of the resistor R2, and a current corresponding to the voltage across the resistor R2 starts flowing through the capacitor C4. As a result, the output signal voltage $E_o$ at the output terminal 9 starts increasing from zero as shown in FIG. 2E. The increasing voltage is added to the input voltage $E_{Bi}$ to the amplifier 6 via the capacitor C3, and hence the input voltage $E_{Bi}$ linearly increases as indicated by "b" in FIG. 2C. In other words, the input terminal of the amplifier 6 is bootstrapped to the output terminal of the integrator 7 by the capacitor C3, and the capacitor C3 maintains a constant voltage v1 until the next sampling instant t2. The voltage v1 corresponds to the difference voltage $\Delta E_i (= E_{i1} - E_{i0})$ between the input signal voltages at the present sampling instant and the preceding sampling instant. In other words, the capacitor C3 maintains the voltage difference between the input signal voltage and the output signal voltage at the present sampling instant until the next sampling instant.

At the next sampling instant t2, the input signal voltage $E_i$ becomes $E_{i2}$, and at the same time, the input voltage $E_{Bi}$ to the amplifier 6 also becomes $E_{i2}$. Thus, the voltage $E_c$ across the capacitor C3 becomes v2 $(= E_{i2} - E_{i1})$. Until the next sampling instant t3, the voltage $E_c$ across the capacitor C3 is maintained at v2, and the output voltage $E_o$ linearly increases. As a result, the input voltage to the amplifier 6 also linearly increases as indicated by "c" in FIG. 2C.

Further, the timing of the sampling pulses SP2 can be arbitrary determined as long as the sampling pulses are placed within a range in which the input signal voltage $E_i$ is settled. Consequently, a fine adjustment of the timing between the sampling pulses SP2 and the input signal is not required. In addition, the effects of distortions such as glitches or overshoots in the vicinity of the transitions of the input signal voltage $E_i$ can be eliminated. Furthermore, at each sampling instant a current flows through the capacitor C3 for charging the difference voltage between the input terminal 8 and the output terminal 9. A variation of the output voltage E0 across the capacitor C4 due to this current is prevented by setting the capacitances C3 and C4 such that C3<<C4.

The time constant of the integrator 7 specified by the resistor R2 and the capacitor C4 is determined so that the variation ΔE0 of the voltage $E_o$ across the capacitor C4, which is the change of the output voltage $E_o$ during the two consecutive sampling instants, becomes equal to the variation $\Delta E_i$ of the input signal voltage $E_i$ during the sampling time interval t just before the two consecutive sampling instants.

More specifically, assuming that $E_i=E_o$ initially, the current i flowing through the capacitor C4 is $\Delta E_i/R2$. Hence, the value C4 can be expressed as $$C4=i\times t/\Delta Eo=(\Delta Ei\times t)/(R2\times\Delta Eo).$$

Here, in order that $\Delta E_i=\Delta E_o$ is satisfied, $$C4=t/R2 \quad (1).$$

After the input signal voltage $E_i$ changes by $\Delta E_i$ from the initial condition of $E_o=E_i$, the switch SW2 is closed by the sampling pulse SP2, the voltage change $\{(E_i+\Delta E_i)-E_o\}$, i.e. $\Delta E_i$, appears across the capacitor C3.

Next, in response to the voltage change $\Delta E_i$ across the capacitor C3, the amplifier 6 having a low output impedance current-amplifies its input signal, so that the voltage $\Delta E_i$ is applied to the resistor R2 of the integrator 7 after the current amplification by the amplifier 6.

As a result, the current $i=\Delta E_i/R2$ starts flowing through the resistor R2 and the capacitor C4 so that the output signal voltage $E_o$ starts increasing at a rate of $(i\times t)/C4$. At the same time, the voltage across the resistor R2 is maintained at $\Delta E_i$ because the voltage change of the output signal voltage $E_o$ is fed back to the input of the amplifier 6 through the capacitor C3. Thus, the current i flowing through the capacitor C4 is also maintained constant.

Consequently, an inclined voltage having a gradient corresponding to the difference $\Delta E_i$ of the input signal voltage $E_i$ is produced in the output voltage $E_o$ across the capacitor C4. In this case, if the resistor R2 and the capacitor C4 are selected such that C4=t/R2, the output voltage $E_o$ reaches a value of $E_o=E_i+\Delta E_i$ just before the next sampling instant. As a result, the stepped input signal applied to input terminal 8 is linearly interpolated to generated an interpolated voltage from the output terminal 9 as the output signal, as shown in FIG. 2F.

SECOND EMBODIMENT

Figure 3A:
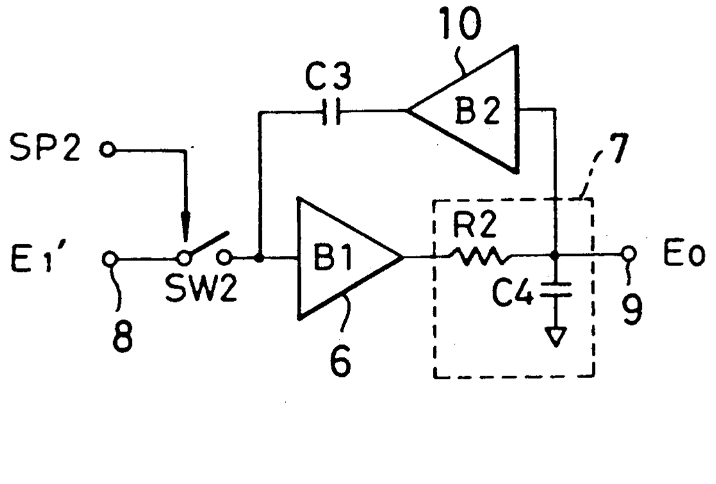
FIGS. 3A and 3B are circuit diagrams showing arrangements of a second embodiment of a linear interpolator according to the present invention.

FIG. 3A shows a second embodiment of a linear interpolator according to the present invention. As shown in FIG. 3A, this linear interpolator has an arrangement similar to that of the linear interpolator of the first embodiment except that this linear interpolator has a second amplifier 10 in addition to the first amplifier 6. More specifically, the input terminal of the second amplifier 10 is connected to the output terminal of the integrator 7. The output terminal of the amplifier 10 is connected to one end of the capacitor C3. The other end of the capacitor C3 is connected to the input terminal of the first amplifier 6. The switch SW2 is connected between the input terminal 8 and the input terminal of the first amplifier 6. The integrator 7 is connected between the output terminal of the first amplifier 6 and the output terminal 9.

Figure 3B:
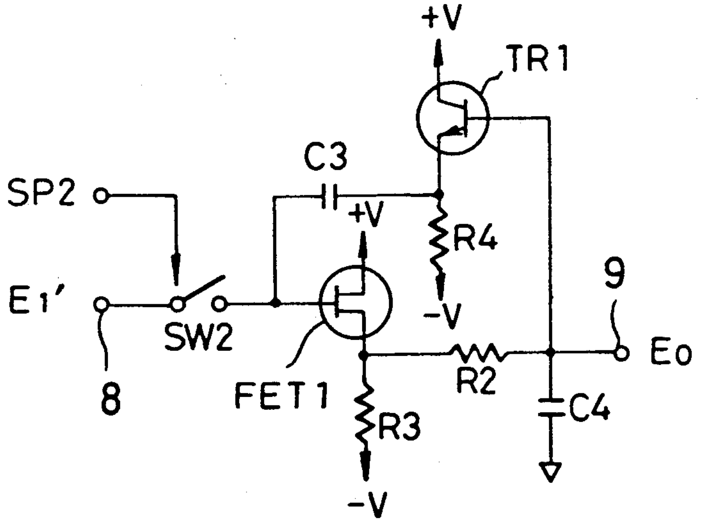

FIG. 3B shows by way of illustration and not limitation, one more detailed circuit arrangement of the linear interpolator of the second embodiment. The first amplifier 6 comprises a field effect transistor FET1 and a resistor R3. The gate of the field effect transistor FET1 is connected to the capacitor C3. A voltage source +V is applied to the drain of the field effect transistor FET1 and a voltage source −V is applied to the source of the field effect transistor FET1 via the resistor R3, to which the resistor R2 is connected. The second amplifier 10 comprises a bipolar transistor TR1 and a resistor R4. The base of the transistor TR1 is connected to the output terminal 9. The voltage source +V is applied to the collector of the transistor TR1 and the voltage source −V is applied to the emitter of the transistor TR1 via the resistor R4, to which the capacitor C3 is connected.

With this arrangement, the linear interpolator operates like that of the first embodiment. In addition, the relationship C3<<C4 that must be satisfied by the capacitors C3 and C4 in the first embodiment is not required. This is because a current for charging the capacitor C3, which flows in response to a voltage difference between the input terminal 8 and the output terminal 9 at each sampling instant, is given by the second amplifier 10, and hence, the output voltage $E_o$ of the capacitor C4 is not varied by the current flowing through the capacitor C3. Thus, the condition that C3<<C4 can be obviated. In addition, the second amplifier 10 can prevent the sampling pulse from leaking through the capacitor C3 toward the output terminal 9.

THIRD EMBODIMENT

Figure 4:
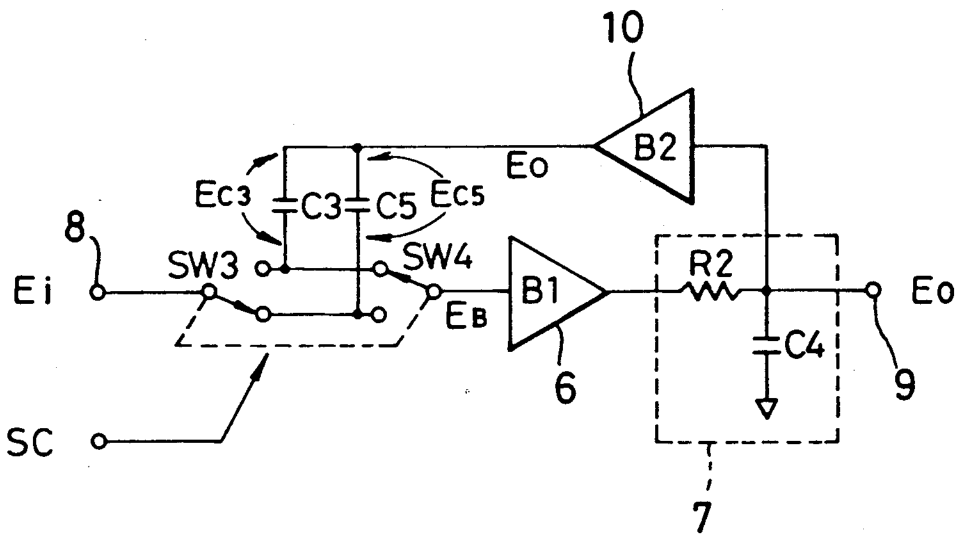
FIG. 4 is a circuit diagram showing an arrangement of a third embodiment of a linear interpolator according to the present invention.

FIG. 4 shows a third embodiment of a linear interpolator according to the present invention, and FIGS. 5A-5F illustrate timings and waveforms of the input and output signals in various parts of the linear interpolator.

As shown in FIG. 4, the basic arrangement of this linear interpolator is similar to that of the second embodiment except that this linear interpolator is so arranged that two capacitors are alternately used for bootstrapping. More specifically, first ends of the capacitors C3 and C5 are connected in common to the output terminal of the second amplifier 10, the second ends thereof are connected alternately to the input terminal 8 and the input terminal of the first amplifier 6 by the switches SW3 and SW4. The other portions of the circuit are arranged similarly to that of the second embodiment. That is, the integrator 7 is connected between the output of the first amplifier 6 and the output terminal 9. The output terminal of the integrator 7 is connected to the input terminal of the second amplifier 10. The two switches SW3 and SW4 operate in response to a sampling clock SC, so that one of the second ends of the two capacitors C3 and C5 is connected to the input terminal 8, while the other of the second ends is connected to the input terminal of the first amplifier 6, and vice versa.

Figures 5A, 5B, 5C, 5D, 5E, 5F:
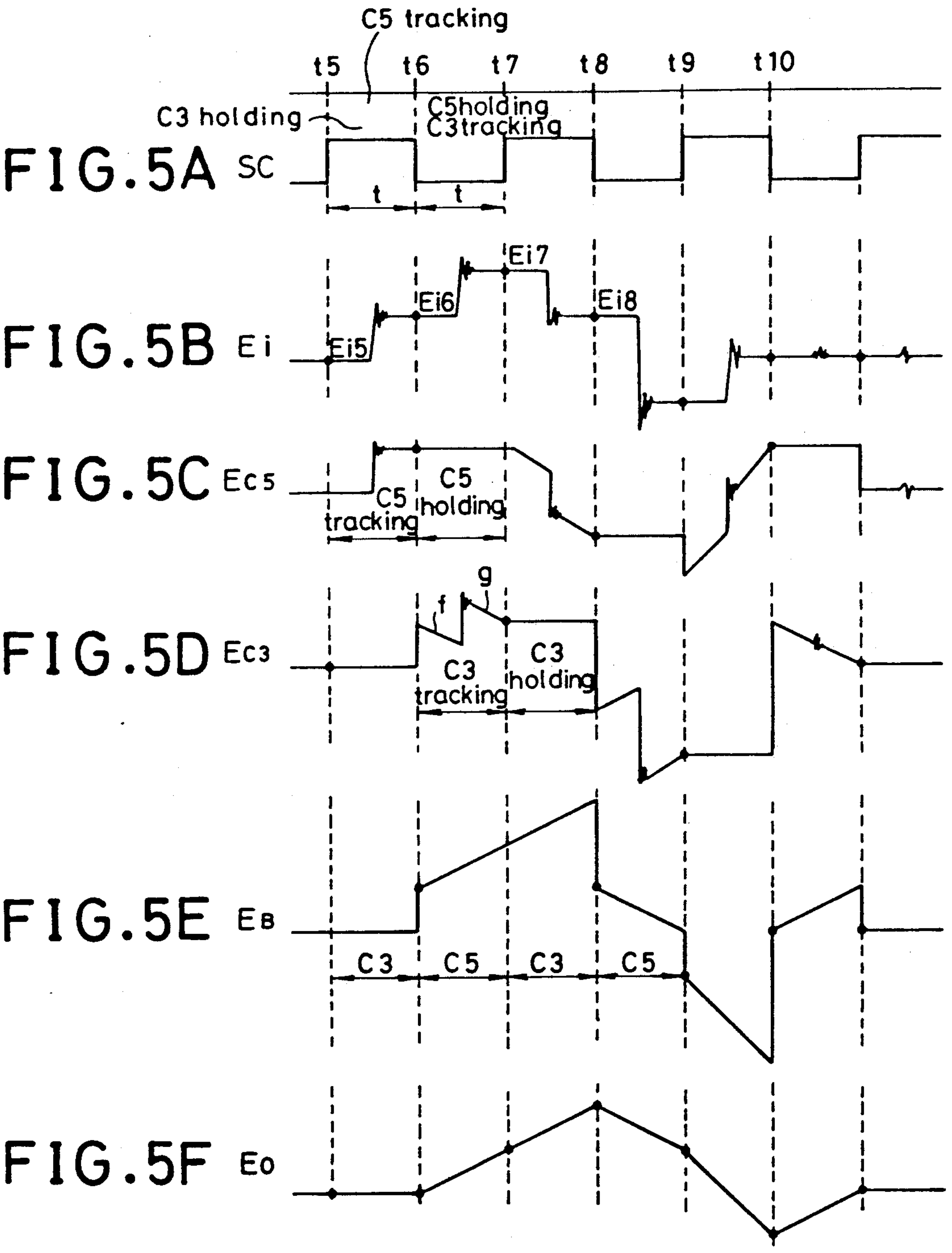
FIGS 5A-5F are timing charts illustrating input and output signal waveforms and timings in various parts of the embodiment shown in FIG. 4.

With this arrangement, the linear interpolator operates in a manner basically similar to that of the second embodiment, and the signal waveforms and the timings of various portions are illustrated in FIGS. 5A-5F. As shown in FIGS. 5A and 5B, the sampling clock SC varies at the same time interval as the time interval t of the input signal, and the timing of a transition of the sampling clock SC is adjusted relative to the input signal so as to be positioned at the center between the two consecutive transition points of the input signal. Between instants t5 and t6, the input signal voltage $E_i$ rises from $E_{i5}=0$ to $E_{i6}$, as shown in FIG. 5B. In addition, the capacitor C5 tracks the input signal voltage $E_i$ through the switch SW3, and is charged to the voltage $E_{i6}$, whereas the second end of the capacitor C3 is connected to the input terminal of the first amplifier 6 through the switch SW4. During the time period from instant t5 to instant t6, the voltage $E_{c3}$ across the capacitor C3 is zero, as shown in FIG. 5D, and the output signal voltage $E_o$ at the output terminal of the integrator 7 is also zero, as shown in FIG. 5F.

During the next time period from instant t6 to instant t7, the second end of the capacitor C5 is connected to the input terminal of the first amplifier 6 through the switch SW4, so that the output signal voltage $E_o$ at the output terminal of the integrator 7 increases linearly, as shown in FIG. 5F, while maintaining the voltage $E_{c5}$ across the capacitor C5. With the increase in the output signal voltage $E_o$, the input voltage $E_B$ also increases linearly, as shown in FIG. 5E, because the input terminal of the first amplifier 6 is bootstrapped by the output terminal of the integrator 7 through the capacitor C5 and the second amplifier 10.

During this time period from instant t6 to instant t7, the capacitor C3 tracks the input signal voltage $E_i$ through the switch SW3, as shown in FIG. 5D, so that the capacitor C3 is charged to the voltage $E_{i6}$ and then to the voltage $E_{i7}$. The voltage $E_{c3}$ across the capacitor C3 linearly decrease in accordance with the timings of the voltages $E_{i6}$ and $E_{i7}$, as indicated by "f" and "g" in FIG. 5D. This is because a voltage increment at the output terminal of the integrator 7 is subtracted from the signal voltages $E_{i6}$ and $E_{i7}$ through the second amplifier 10.

During the next time period from instant t7 to instant t8, the second end of the capacitor C3 is connected to the input terminal of the first amplifier 6 through the switch SW4, so that the output signal voltage $E_o$ increases linearly, as shown in FIG. 5F, from the voltage at instant t7. On the other hand, the capacitor C5 tracks the input signal voltage $E_i$ through the switch SW3, as shown in FIG. 5C.

In this manner, when one of the two capacitors C3 and C5 is connected to the input terminal of the first amplifier 6, a voltage across the capacitor is maintained at a voltage corresponding to the input voltage $E_i$ at the preceding timing, whereas the other capacitor tracks the input signal voltage $E_i$. As a result, an output signal voltage $E_o$ which is formed by linearly interpolating the input signal voltage $E_i$ is continuously derived from the output terminal 9.

Furthermore, since the tracking time period of the input signal voltage $E_i$ can be sufficiently long, reliability of the circuit's operation increases, and the switches SW3 and SW4 can be switched at a high speed so that the sampling frequency can be made higher. In addition, the circuit for generating sampling clock SC can be made simpler, because a narrow width pulse signal is not required to control the switches SW3 and SW4.

FOURTH EMBODIMENT

Figure 6:
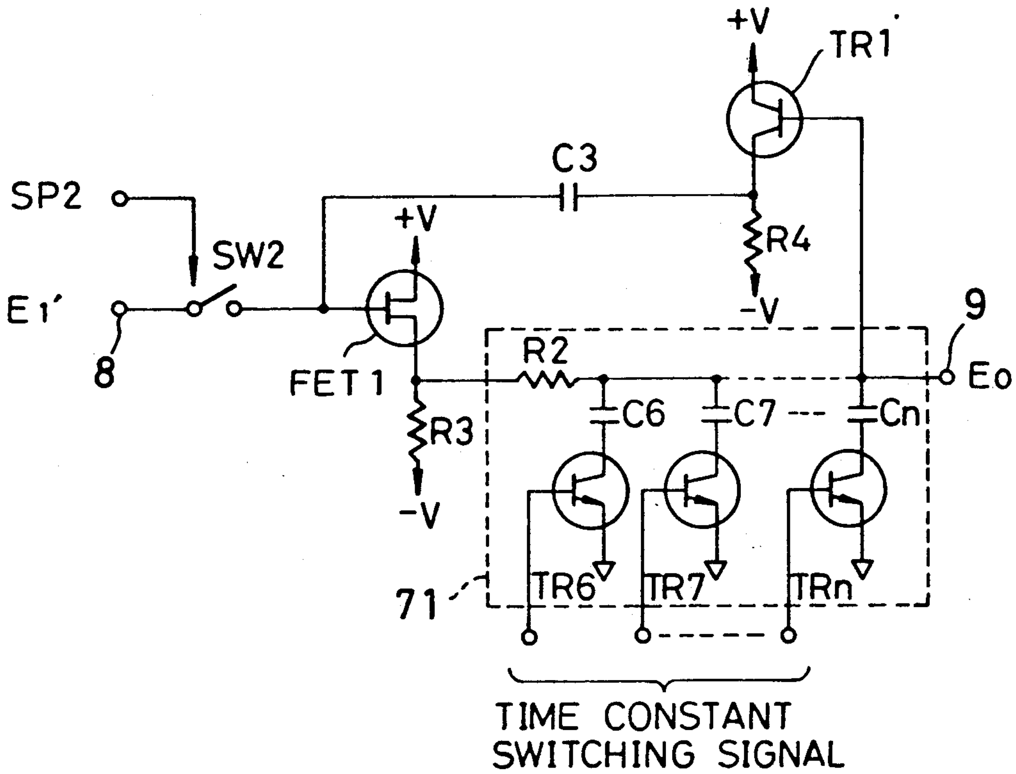
FIG. 6 is a circuit diagram showing an arrangement of a fourth embodiment of a linear interpolator according to the present invention.
Figure 7:
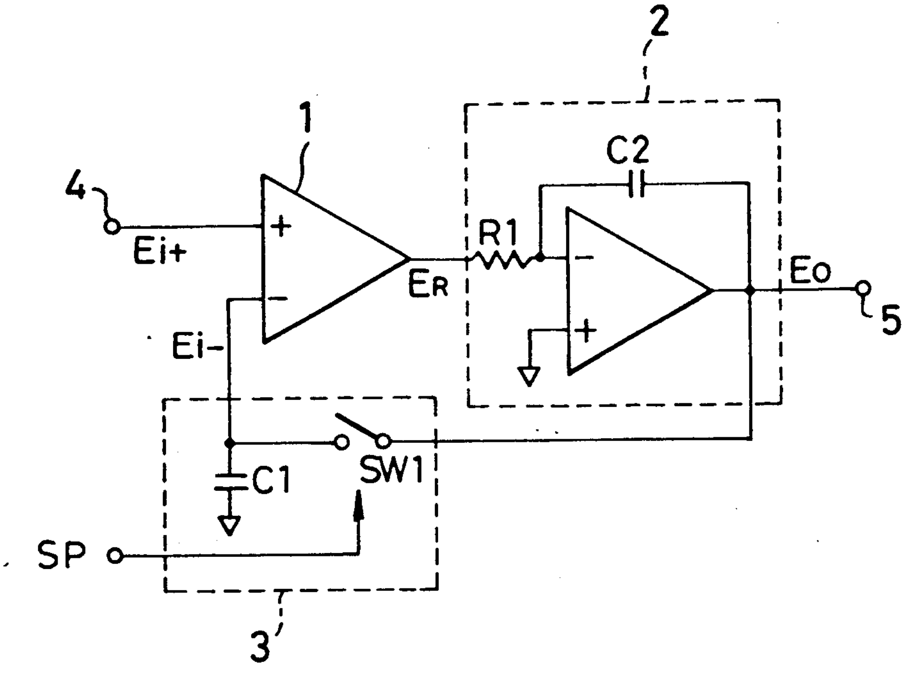
FIG.7 (PRIOR ART)
FIG. 7 is a circuit diagram showing an arrangement of a conventional linear interpolator.
Figures 8A, 8B, 8C, 8D, 8E:
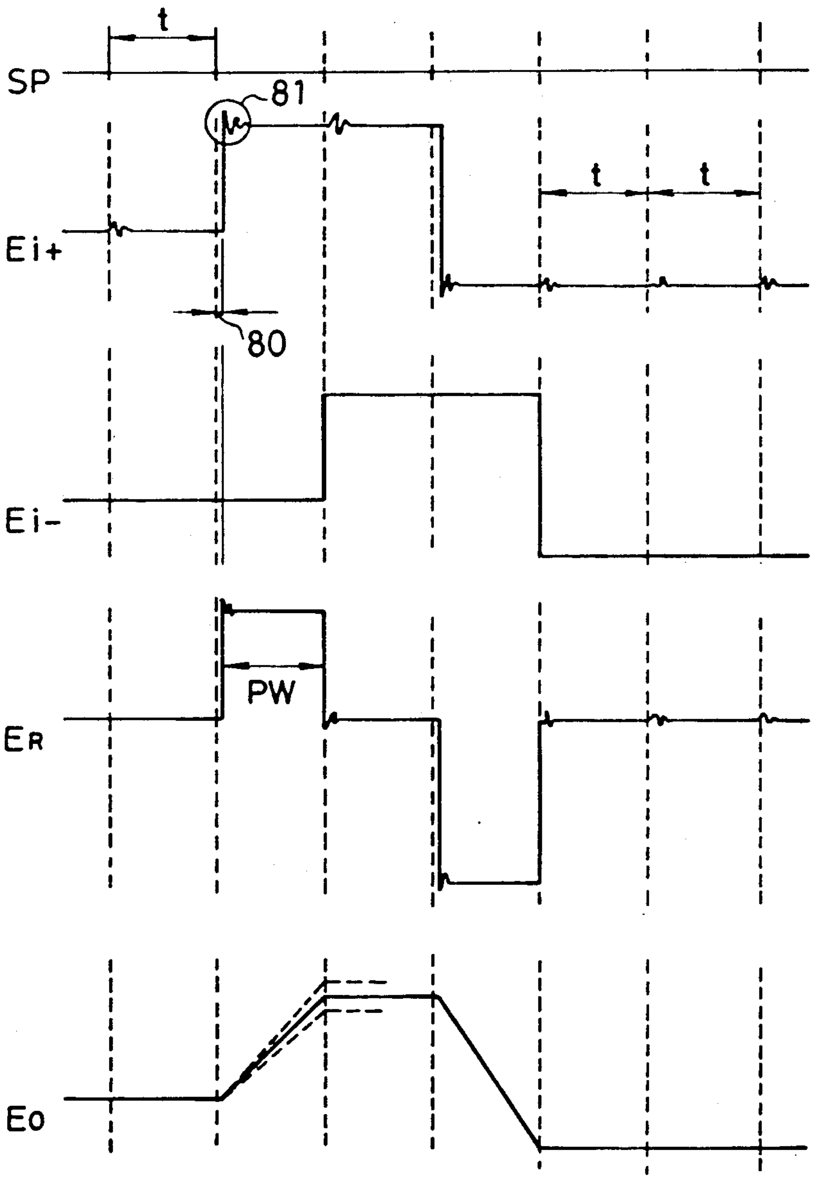
FIG.8A (PRIOR ART)
FIG.8B (PRIOR ART)
FIG.8C (PRIOR ART)
FIG.8D (PRIOR ART)
FIG.8E (PRIOR ART)
FIGS. 8A-8E are timing charts illustrating input and output signal waveforms and timings in various parts of the linear interpolator shown in FIG. 7.

FIG. 6 shows a fourth embodiment of a linear interpolator according to the present invention. In this embodiment, the time constant of an integrator 71 can be selected so that the integrator can use two or more types of sampling pulses of different periods. The other portions of the circuit arrangement are similar to those of the second embodiment.

As shown in FIG. 6, the integrator 71 comprises a resistor R2, a plurality of capacitors C6, C7, . . . Cn, and a plurality of transistors TR6, TR7, . . . , TRn functioning as switches for grounding each of the plurality of capacitors C6, C7, . . . , Cn. The first terminals of the capacitors C6, C7 . . . , Cn are connected in common to the output terminal 9. The second terminals of the capacitors C6, C7, . . . , Cn are connected to the collectors of the transistors TR6, TR7, . . . , TRn, respectively. The emitters of these transistors are grounded. A time constant switching signal is supplied to the bases of these transistors, respectively, such that only one of the transistors TR6, TR7, . . . TRn to which the time constant switching signal is inputted is turned on. Thus, only one capacitor connected to the transistor thus turned on is grounded to form the desired time constant with the resistor R2.

In this way, the capacitors of the integrator 71 can be selected to satisfy equation (1), so that the period of the sampling pulse can be appropriately changed.

According to this embodiment, a staircase input signal can be outputted in its original form or as applied to the input terminal 8 from the output terminal 9 by turning off all the transistors TR6-TRn of the integrator 71 so that all the capacitors C6-Cn are disconnected from ground, and by closing the switch SW2. Accordingly, this circuit can selectively output either a staircase or dotted display waveform or a linearly interpolated waveform when it is applied to a display circuit of, for example, a digital oscilloscope, a signal waveform analyzer or the like.

Although specific embodiments of a linear interpolator constructed in accordance with the present invention have been disclosed, it is not intended that the invention be restricted to either the specific configurations or uses disclosed herein. Modifications may be made in a manner obvious to those skilled in the art.

The invention has been described in detail with respect to preferred embodiments, and it will now be apparent from the foregoing to those skilled in the art that changes and modifications may be made without departing from the invention in its broader aspects.

What is claimed is:

1. A linear interpolator for linearly interpolating an input signal, comprising:

a first amplifier having an input terminal and an output terminal for producing a first signal;

switching means for periodically supplying the input signal to said input terminal of said first amplifier;

integrator means, having an input terminal and an output terminal, said input terminal of said integrator means being connected to said output terminal of said first amplifier, for integrating said first signal;

feedback means, connected between said input terminal of said first amplifier and said output terminal of said integrator means, for bootstrapping the voltage at said input terminal of said first amplifier by the voltage at said output terminal of said integrator means.

2. The linear interpolator as claimed in claim 1, wherein said feedback means comprises a capacitor.

3. The linear interpolator as claimed in claim 1, wherein said feedback means comprises a capacitor connected in series with a second amplifier.

4. The linear interpolator as claimed in claim 3, wherein at least one of said first amplifier and said second amplifier has a gain equal to or greater than one.

5. The linear interpolator as claimed in claim 1, wherein said feedback comprises first and second capacitors and wherein said switching means alternately and periodically controls said first and second capacitors such that one of said first and second capacitors tracks said input signal and another of said first and second capacitors is connected to said input terminal of said first amplifier.

6. The linear interpolator as claimed in claim 1, wherein said integrator means comprises a resistor, a plurality of capacitors connected in common to said resistor, and means for selecting one of said plurality of capacitors to form a time constant circuit including said resistor and said selected capacitor.

* * * * *